(12) United States Patent
Bae et al.

(10) Patent No.: US 7,687,755 B2
(45) Date of Patent: Mar. 30, 2010

(54) CMOS IMAGE SENSOR AND OPERATING METHOD THEREOF

(75) Inventors: Jeong-Hoon Bae, Seoul (KR); Tae-Seok Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 12/071,139

(22) Filed: Feb. 15, 2008
(Under 37 CFR 1.47)

(65) Prior Publication Data
US 2009/0057535 A1    Mar. 5, 2009

(30) Foreign Application Priority Data
Feb. 16, 2007  (KR) .................. 10-2007-0016520

(51) Int. Cl.
*H01L 31/112* (2006.01)
*H01L 27/30* (2006.01)
(52) U.S. Cl. .................. 250/208.1; 348/294; 257/292
(58) Field of Classification Search ............... 250/208.1; 348/294; 257/292
See application file for complete search history.

(56) References Cited

U.S. PATENT DOCUMENTS

2006/0175534 A1*  8/2006  Barna et al. ............... 250/208.1

FOREIGN PATENT DOCUMENTS

| JP | 2005-167579 | 6/2005 |
| JP | 2005-244435 | 9/2005 |
| KR | 1020010090613 | 10/2001 |
| KR | 10-2004-0044809 | 5/2004 |

* cited by examiner

*Primary Examiner*—Seung C Sohn
(74) *Attorney, Agent, or Firm*—Harness, Dickey & Pierce, P.L.C.

(57) ABSTRACT

A CMOS image sensor may be provided. The CMOS image sensor may include at least one floating diffusion column line, a plurality of pixels, and/or a charge/voltage conversion circuit. The plurality of pixels may be connected to the floating diffusion column line in parallel. The charge/voltage conversion circuit may be connected to one end of the floating diffusion column line, and may detect a potential variation of the floating diffusion column line using a coupling capacitor.

16 Claims, 6 Drawing Sheets

CMOS IMAGE SENSOR AND OPERATING METHOD THEREOF

PRIORITY STATEMENT

The present application hereby claims priority under 35 U.S.C. §119 on Korean Patent Application No. 10-2007-0016520, filed on Feb. 16, 2007, the entire contents of which are hereby incorporated by reference.

BACKGROUND

A charge coupled device (CCD) image sensor or a CMOS image sensor (CIS) may be generally used as an image sensor.

A CIS may be classified as an active pixel sensor (APS) or a passive pixel sensor (PPS). APSs may be widely used due to their advantageous characteristics and operating speed. CISs may be used in low-priced digital still cameras. CCDs may be used in video cameras.

Generally, CISs may be manufactured using a CMOS process. Accordingly, CISs may have lower fabrication costs and lower power consumption compared to CCDs. For this reason, CISs may be widely used in battery-operated devices such as mobile phones and other mobile terminals.

CISs may include a photodiode as a photoelectric conversion element. CISs may measure the amount of electric charge integrated in the photodiode using a drive transistor or the like in a pixel to convert the intensity of incident light into electrical signals.

CISs may be classified into three-transistor (3T) type CISs, four-transistor (4T) type CISs, etc. A 3T type CIS may include a photodiode, a reset transistor, a source follower transistor and a select transistor. A 4T type CIS may further include a transfer transistor provided between the photodiode and the reset transistor in addition to the elements of the 3T type CIS.

FIG. 1 is an equivalent circuit diagram of a conventional unit pixel in a 4T type CIS.

Referring to FIG. 1, a conventional unit pixel 10 may include a reset transistor 12, a transfer transistor 14, a drive transistor 16, a select transistor 18, and a floating diffusion FD formed at a connection point between the transfer transistor 14 and the reset transistor 12.

An operation thereof will be briefly described. In the conventional 4T type CIS, the floating diffusion FD may be set to a reset level using the reset transistor 12. Afterward, the 4T type CIS may drive the transfer transistor 14 to transfer photocharges integrated in a photodiode 11 to the floating diffusion FD, and therefore vary a potential thereof. The potential variation may be outputted to a signal line via the drive transistor 16. A noise-removed signal may be outputted by detecting a difference between a reset potential of the floating diffusion FD and a potential of the floating diffusion FD after the charges of the photodiode 11 are transferred thereto.

The conventional 4T type image sensor may perform a photocharge transfer function of providing a transfer path so that a transfer transistor 14 may transfer photocharges to the floating diffusion column lines CL1 to CLm. The time taken to perform this function may be referred to as an effective integration time (EIT). Simultaneously, the conventional 4T type image sensor may also perform a photocharge discharge function of providing a discharge path so that the transfer transistor together with a reset transistor 12 may discharge unnecessary photocharges integrated in the photodiode 11. The time taken to perform this function may be referred to as a non-effective integration time (NIT).

The transfer transistor 14 of the conventional image sensor as illustrated in FIG. 1, may repeatedly extract charges integrated in the photodiode 11. That is, the charges may be transferred through a path along the photodiode 11, the transfer transistor 14, the floating diffusion FD, the reset transistor 12, and the power supply voltage (VDD) terminal in sequence.

When a row select signal is inputted into the select transistor 18, the drive transistor 16 may drive an output terminal (EIT section). When a row select signal is not be inputted into the select transistor 18, the drive transistor 16 may not drive the output terminal (NIT section).

Recently, there has been provided a 5T type APS in which an overflow drain transistor may be further provided to prevent an overflow of photocharges generated at the photodiode.

As the performance of image sensors increases, the number of transistors in a pixel may also increase, and therefore, a fill factor, which is a ratio of a photodiode area to a pixel area, may decrease. As a result, the photosensitivity of the image sensor may deteriorate.

SUMMARY

Example embodiments may provide a CMOS image sensor improving a photosensitivity thereof.

Example embodiments may provide a CMOS image sensor including at least one floating diffusion column line, and/or a charge/voltage conversion circuit. A CMOS image sensor may also include a plurality of pixels. The plurality of pixels may be connected to the floating diffusion column line in parallel, generate a plurality of photocharges in proportion to an intensity of light incident from the outside, integrate the plurality of photocharges, and/or transfer the integrated photocharges to the floating diffusion column line. The charge/voltage conversion circuit may be connected to an end of the floating diffusion column line, detect a potential variation of the floating diffusion column line depending on a variation of the transferred photocharges, and/or generate a voltage signal corresponding to the potential variation to output the voltage signal.

According to example embodiments, a method for operating a CMOS image sensor may include converting an optical signal into an electric signal, transferring the electric signal to a floating diffusion column line, and/or detecting a potential variation of the floating diffusion column line using a coupling capacitor.

According to example embodiments of the CMOS image sensor and operating method thereof, a number of transistors used in a unit pixel may be reduced to improve a fill factor, thereby increasing photosensitivity of the image sensor.

BRIEF DESCRIPTION

The accompanying figures are included to provide a further understanding of example embodiments, and are incorporated in and constitute a part of this specification. The drawings illustrate example embodiments and, together with the description, serve to explain principles of example embodiments. In the figures.

DETAILED DESCRIPTION

Figure 1:
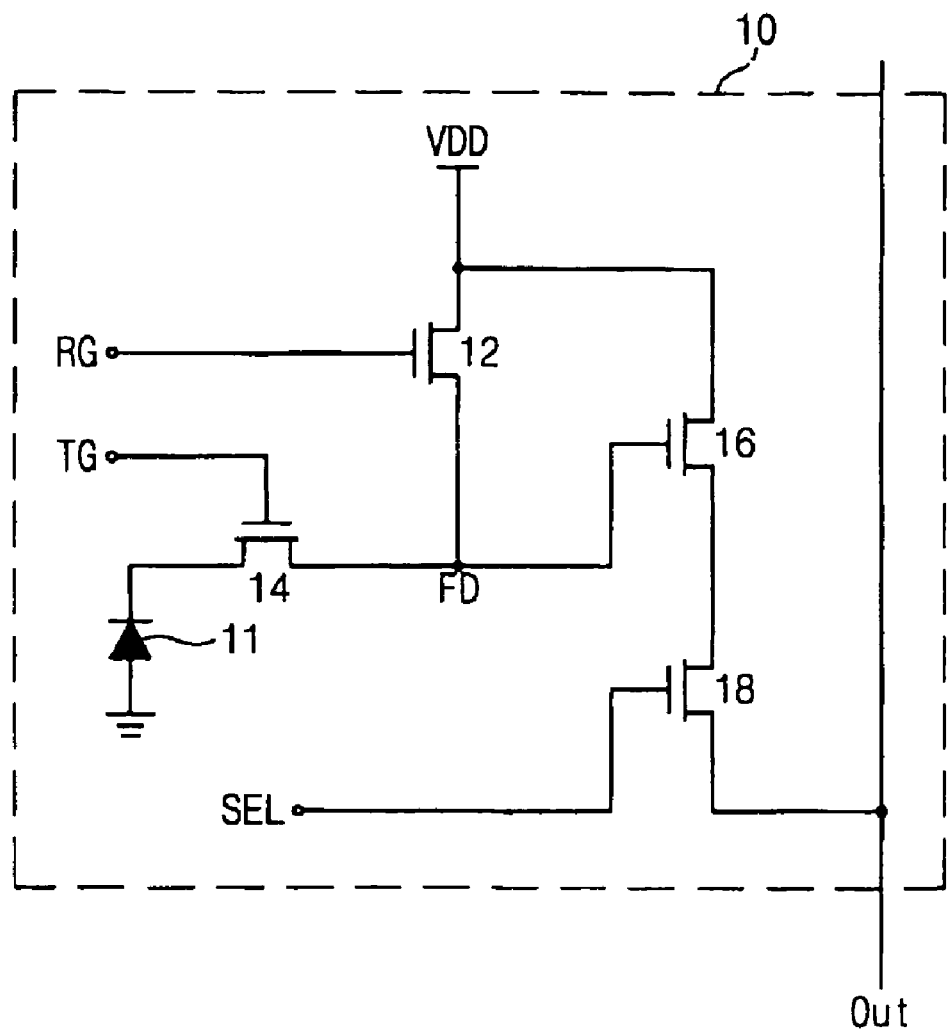
FIG. 1 is a conventional equivalent circuit diagram of a unit pixel in a 4T type CMOS image sensor.

Example embodiments will now be described more fully with reference to the accompanying drawings. In the drawings, the thicknesses of regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, in the following description, specific details such as concrete process flow may be described to provide more general understandings of example embodiments. However, it is obvious to those skilled in the art that example embodiments may be implemented even without the specific details. Moreover, detailed descriptions related to well-known functions or configurations will not necessarily apply to any obscure subject matter of example embodiments.

Now, in order to more specifically describe example embodiments, example embodiments will be described in detail with reference to the attached drawings. However, example embodiments are not limited to the embodiments described herein, but may be embodied in various forms.

Although the example embodiments have been disclosed for illustrative purposes, those skilled in the art will appreciate that various modifications, additions and substitutions are possible, without departing from the scope and spirit of example embodiments as disclosed in the accompanying claims.

Figure 2:
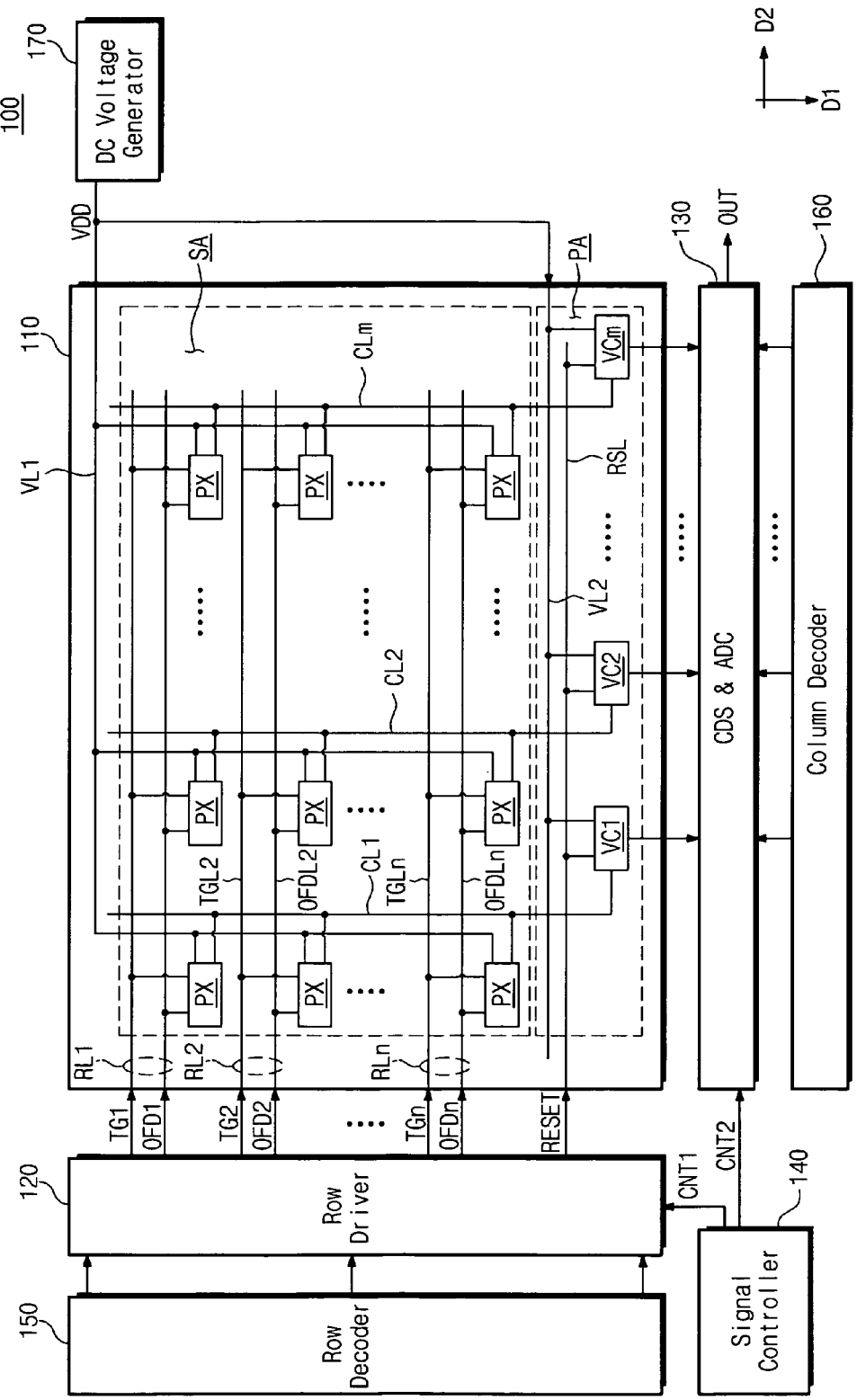
FIG. 2 is a block diagram of a CMOS image sensor according to example embodiments.

FIG. 2 is a block diagram of a CMOS image sensor 100 according to example embodiments.

Referring to FIG. 2, a CMOS image sensor 100 according to example embodiments may include a pixel sensor array 110, a row decoder 150, a row driver 120, a correlated double sampling unit and an analog digital converter (CDS & ADC) 130, a column decoder 160 and a signal controller 140. The CMOS image sensor 100 may further include a DC voltage generator 170.

In response to a driving signal, the pixel sensor array 110 may convert an external optical image input into an analog type voltage signal, and then output the voltage signal. The driving signal may include a transfer gate signal TG, an overflow drain signal OFD and a reset gate signal RESET. The row driver 120 may receive a decoded signal from the row decoder 150. The row driver 120 may convert the decoded signal into a driving signal and output the driving signal in response to a first control signal CNT1.

The CDS & ADC 130 may convert the analog type voltage signal into a digital type voltage signal and output the digital type voltage signal in response to a second control signal CNT2 of the signal controller 140. As such, the signal controller 140 may output the first and second signals CNT1 and CNT2. Although not illustrated in FIG. 2, the signal controller 140 may also generate addressing signals for outputting an image signal selected and detected in each pixel, and then may input the addressing signals to the row decoder 150 and the column decoder 160.

The DC voltage generator 170 may generate a power supply voltage VDD, and then provide the power supply voltage VDD to an n×m number of pixels PX and charge/voltage conversion circuits VC1 to VCm.

A CMOS image sensor 100 according to example embodiments will be more specifically described.

The pixel sensor array 110 may be divided into a first region SA detecting light incident from the outside and a second region PA adjacent to the first region SA.

The n×m (where n and m are integers greater than 1) number of pixels PX may be arranged in a matrix form on the first region SA in the pixel sensor array 110. Generally, an n number of row line pairs RL1 to RLn extending in a first direction and m number of floating diffusion column lines CL1 to CLm extending in a second direction substantially perpendicular to the first direction may be provided in the first region SA. Also, a plurality of power supply lines VL1 and VL2 supplying the power supply voltage may be further provided to the first region SA.

The n number of row line pairs RL1 to RLn and the m number of floating diffusion column lines CL1 to CLm may define a plurality of pixel regions, each of which may include a pixel PX. The pixel PX located at each pixel region may be electrically connected to a corresponding row line pair RL and a corresponding floating diffusion column line CL.

Each of the row line pairs RL1 to RLn may include a transfer gate line TGL and an overflow drain line OFDL. The pixel PX may receive a transfer gate signal TG via the transfer gate line TGL and an overflow drain signal OFD via the overflow drain line OFDL.

Figure 3:
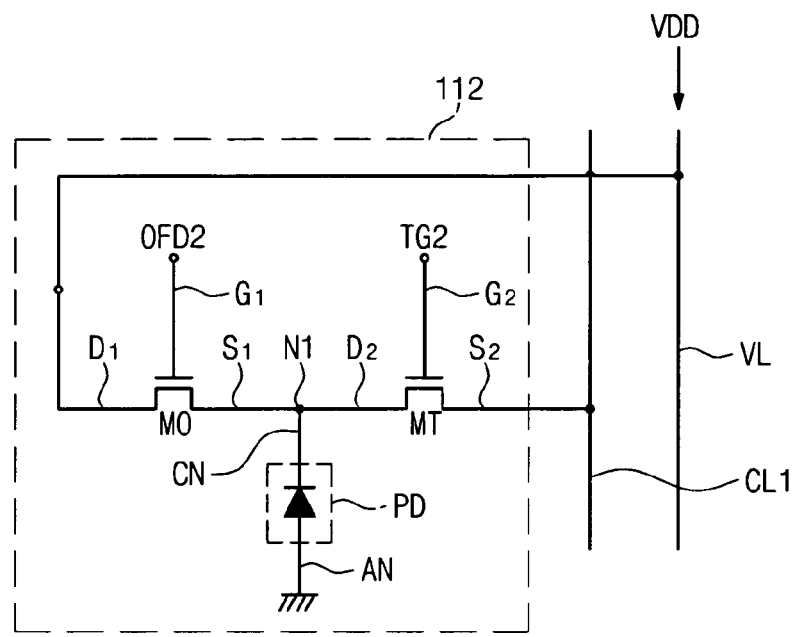
FIG. 3 is an equivalent circuit diagram of a unit pixel as illustrated in FIG. 2.

FIG. 3 is an equivalent circuit diagram of a unit pixel PX as illustrated in FIG. 2, which illustrates one of the pixels PX connected to a second row line pair RL2 and a first floating diffusion column line CL1.

A pixel 112 according to example embodiments may be designed to be a 2T type in order to improve a fill factor. The fill factor may be a characteristic value determining a photo-sensitive performance of an image sensor, which may be the ratio of a photodiode area to total image sensor area.

Compared to the pixel configuration of the conventional CMOS image sensor of FIG. 1, the pixel 112 of the CMOS image sensor of FIG. 3, according to example embodiments, excludes a reset transistor (12 of FIG. 1), a drive transistor (16 of FIG. 1) and a select transistor (18 of FIG. 1), but includes a transfer transistor (14 of FIG. 1). The above-described transistors constitute a charge/voltage conversion circuit connected to an end of each of floating diffusion column lines CL1 to CLm, which will be more fully described below.

Also, a source terminal of a transfer transistor MT included in the pixel 112 according example embodiments forms a floating diffusion (FD) junction capacitor. Source terminals of the transfer transistors commonly connected to a floating diffusion column line may form m number of floating diffusion junction capacitors connected to each other in parallel. The floating diffusion column line CL1 may be connected to a charge/voltage converter VC1 to drive a drive transistor MD.

Referring to FIG. 3, a pixel PX according to example embodiments may include a photodiode PD, an overflow drain transistor MO, and a transfer transistor MT.

The photodiode PD may be a light-receiving element to receive an external optical image, and may generate photocharges in proportion to intensity of light. An anode terminal AN of the photodiode PD may be connected to ground, and a cathode terminal CN may be connected to a contact point N1 where the overflow drain transistor MO and the transfer transistor MT are connected to each other in series.

The overflow drain transistor MO may provide a discharge path so that excess photocharges beyond integration capacity of the photodiode PD may be discharged into a power supply voltage (VDD) terminal. That is, the overflowing drain transistor MO may prevent unnecessary photocharges excessively integrated in the photodiode PD from flowing into the floating diffusion column line CL1.

The overflow drain transistor MO may be electrically connected to an overflow drain line OFDL2 via a first gate terminal G1 to receive an overflow drain signal OFD2

Also, the overflow drain transistor MO may be connected to the power supply voltage VDD via a first drain terminal D1 to receive the power supply voltage VDD, and a first source terminal S1 of the overflow drain transistor MO may be electrically connected to the first node N1.

When the transfer transistor MT is turned off, the overflow drain signal OFD2 may be changed from a logic low level to a logic high level to turn on the overflow drain transistor MO.

The transfer transistor MT may transfer photocharges integrated in the photodiode PD to the floating diffusion column line CL1. The transfer transistor MT may include a second gate terminal G2, a second drain terminal D2 and a second source terminal S2.

The transfer transistor MT may be electrically connected to a transfer gate line TGL2 via the gate terminal G2 to receive a transfer gate signal TG2, and may be electrically connected to the first node N1 via the second drain terminal D2. The transfer transistor MT may be electrically connected to the floating diffusion column line CL1 via the source terminal S2.

Unlike the conventional 4T type image sensor of FIG. 1, the transfer transistor MT included in the pixel 112 according to example embodiments may perform only a photocharge transfer function of providing a transfer path through which photocharges are transferred to the floating diffusion column lines CL1 to CLm. Further, the CMOS image sensor, according to example embodiments, may have diverse paths so that photocharges integrated in a photodiode PD may be extracted depending on EIT or NIT determined by the row select signal.

During EIT, that is, when a specific row line RL is selected, an extraction path may be via the photodiode PD, the transfer transistor MT, the floating diffusion FD (the source terminal of the transfer transistor MT), the reset transistor MR, and the power supply voltage (VDD) terminal in sequence. This may be the same extraction path as shown in the conventional 4T type image sensor as illustrated in FIG. 1.

During NIT, that is, when a specific row line RL is not selected, the extraction path may be via the photodiode PD, the overflow drain transistor MO, and the power supply voltage (VDD) terminal in sequence.

As described above, the extraction path may be changed according to whether the row line RL is selected or not, that is, according to EIT or NIT. Accordingly, the select transistor (18 of FIG. 1) may be excluded from a circuit. Generally, in the conventional 4T type image sensor, the EIT or NIT section may be determined in accordance with whether the select transistor (18 of FIG. 1) is selected or not.

Additionally, because the transfer transistor MT may determine only the EIT section, the CMOS image sensor according to example embodiments need not additionally include a select transistor which may be employed in the conventional CMOS image sensor.

Also, the transfer transistor MT may receive a select signal provided to the conventional select transistor (18 of FIG. 1) as a transfer gate signal. The transfer transistor MT may receive transfer gate signals sequentially in units of a row line, thus making it possible to remove the select transistor from the circuit. As such, two transistors may be removed compared to the conventional 4Ts type of FIG. 1, to improve the fill factor. As a result, photosensitivity of an image sensor may be increased to a higher extent.

Furthermore, the CMOS image sensor 100 according to example embodiments may have an advantage of increasing a photocharge transfer capacity, since floating diffusion column lines CL1 to CLm may be overlapped. That is, column lines CL1 to CLm may be connected in parallel to N number of floating diffusion regions. Therefore, the CMOS image sensor 100 may lessen noise effects occurring in a photodiode PD because the photocharge transfer capacity of transferring the photocharges with optical information from the photodiode PD may be increased.

Referring to FIG. 2, the second region PA may be adjacent to one of the ends of m number of floating diffusion column lines CL1 to CLm. The second region PA may include m number of charge/voltage conversion circuits VC1 to VCm, a reset signal line RSL, and a power supply line VL2 guiding a power supply voltage VDD.

Each of the charge/voltage conversion circuits VC1 to VCm may be connected to one end of each of the floating diffusion column lines CL1 to CLm, and may be commonly connected to the reset signal line RSL. Each of the charge/voltage conversion circuits VC1 to VCm may detect a potential variation of each of floating diffusion column lines CL1 to CLm, thereby generating a voltage signal corresponding to the detected potential variation. In this case, the voltage signal in proportion to the potential variation may be an analog-type voltage signal.

The analog-type voltage signal may be inputted into the CDS & ADC 130, which may convert the inputted analog voltage signal into a digital-type voltage signal, and then outputs the digital-type voltage signal.

Figure 4:
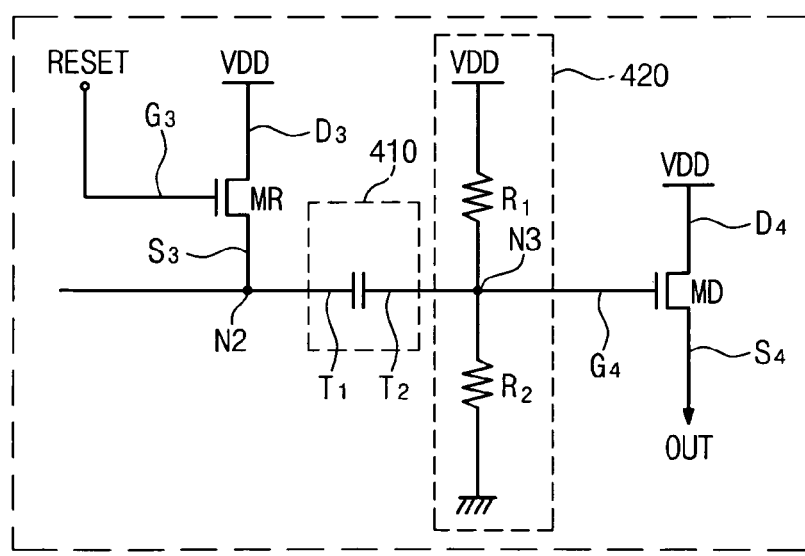
FIG. 4 is a circuit diagram of a charge/voltage conversion circuit as illustrated in FIG. 2.

FIG. 4 is a circuit diagram of a charge/voltage conversion circuit VC as illustrated in FIG. 2.

Referring to FIG. 4, a charge/voltage conversion circuit VC may detect a potential variation in a floating diffusion column line CL1, and may convert the detected potential variation into a voltage signal. The potential variation may be caused by photocharges generated in each pixel PX.

The charge/voltage conversion circuit VC may include a second node N2, a third node N3, a reset transistor MR, a coupling capacitor 410, a drive transistor MD, and a DC biasing unit 420.

The reset transistor MR may reset the floating diffusion column line CL1. The reset transistor MR may include a third gate terminal G3, a third drain terminal D3, and a third source terminal S3. The third gate terminal G3 may be electrically connected to a reset gate line RSL to receive a reset gate signal RESET from a row driver 120. The third drain terminal D3 may be electrically connected to a power supply line VL2 to receive a power supply voltage VDD. The third source terminal S3 may be electrically connected to the second node N2. The second node N2 may be electrically connected to the floating diffusion column line CL1.

In response to the reset gate signal RESET, the reset transistor MR may be turned on and discharge photocharges accumulated in the floating diffusion column line CL1 to initialize the floating diffusion column line CL1 to the reset level. In this case, the floating diffusion column line CL1 may convert a variation of the photocharges transferred via a transfer transistor MT into a potential variation.

A coupling capacitor 410 may compensate for the reduction of a charge/voltage conversion gain (hereinafter, referred to as "CG") due to overlapping of a floating diffusion region FD and the floating diffusion column line CL1. In this case, the CG may infer a ratio of a potential variation to a photocharge variation.

The coupling capacitor 410 may include a first terminal T1 and a second terminal T2. The first terminal T1 may be electrically connected to a second node N2. The second terminal T2 may be electrically connected to a third node N3.

Figure 5:
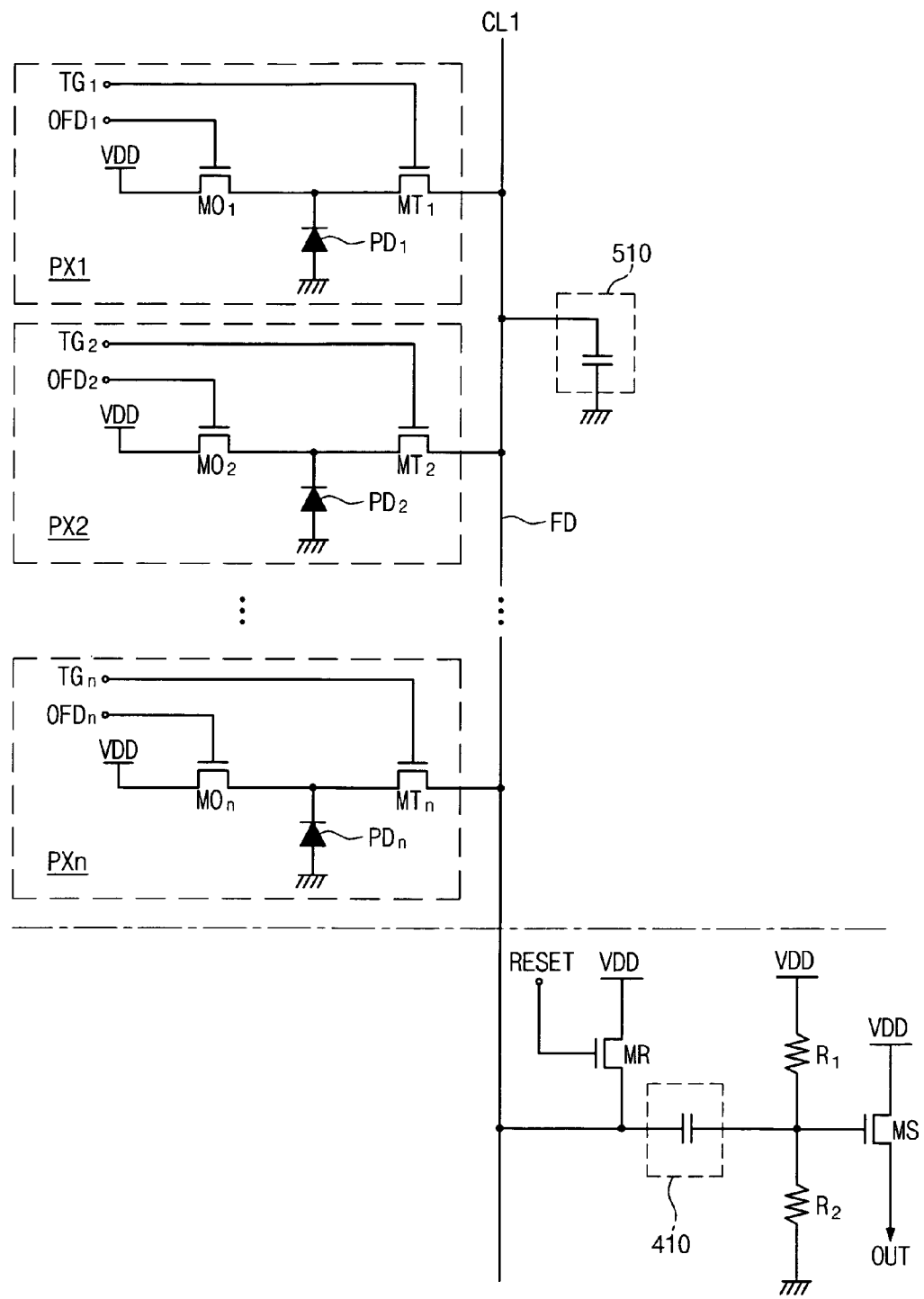
FIG. 5 is a circuit diagram of a plurality of pixels sharing one floating diffusion column line as illustrated in FIG. 2.

FIG. 5 is a circuit diagram of a plurality of pixels PX1 to PXn sharing one floating diffusion column line CL1 as illustrated in FIG. 2, which illustrates a floating diffusion region FD of a CMOS image sensor according to example embodiments.

Referring to FIG. 5, pixels PX1 to PXn may be connected to the floating diffusion column line CL1 in parallel. Accordingly, all the pixels PX1 to PXn may share the floating diffusion region FD.

A photocharge transfer capacity in the floating diffusion region FD may be increased due to an overlapping of the floating diffusion column line CL1 and the floating diffusion region FD. A noise effect occurring in a photodiode may be minimized due to an increase of the transfer capacity.

However, an excessive increase of photocharge transfer capacity may cause a reduction of CG. The CMOS image sensor according to example embodiments may include a coupling capacitor 410 disposed in each of charge/voltage conversion circuits VC1 to VCm to prevent the reduction of CG.

Figure 6:
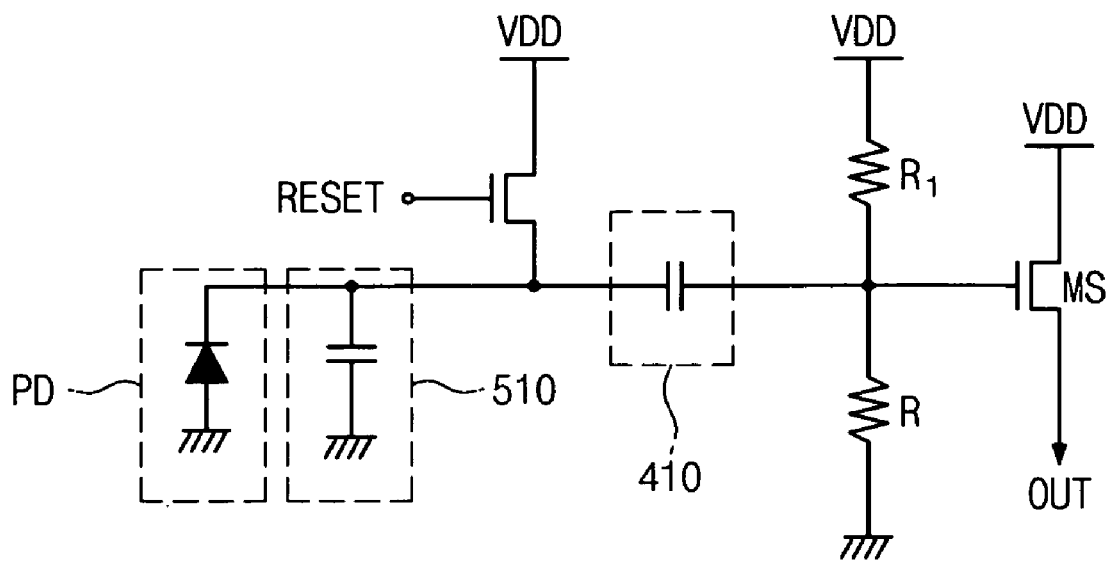
FIG. 6 is an equivalent circuit diagram of a plurality of pixels sharing one floating diffusion column line as illustrated in FIG. 5.

FIG. 6 is an equivalent circuit diagram of a plurality of pixels sharing one floating diffusion column line as illustrated in FIG. 5.

Referring to FIG. 6, assuming a plurality of floating diffusion regions FDs to be one of floating diffusion junction capacitors 510, an equivalent circuit may be expressed as illustrated in FIG. 6. According to the equivalent circuit, a floating diffusion junction capacitor 510 may be connected to a coupling capacitor 410 in series.

Assuming the capacitance of the floating diffusion junction capacitor 510 to be "Cfds," the capacitance of the coupling capacitor 410 to be "Ccup," and total capacitance of both the capacitors 410 and 510 to be "Ctot," the total capacitance Ctot of the floating diffusion junction capacitor 510 and the coupling capacitor 410 may be expressed as a following Equation 1.

$$Ctot = \frac{CfdsCcup}{Cfds + Ccup} \qquad \text{Equation 1}$$

The Equation 1 may also be expressed as a following Equation 2.

$$Ctot = \frac{Ccup}{1 + \frac{Ccup}{Cfd}} \qquad \text{Equation 2}$$

The floating diffusion junction capacitors 510, which may be source terminals of the transfer transistors MT provided in m number of pixels PX1 to PXm, may be connected to each other in parallel. Accordingly, the capacitance Cfds of the floating diffusion junction capacitor 510 may be regarded as being significantly greater than the capacitance Ccup of the coupling capacitor 410.

The total capacitance Ctot of the floating diffusion junction capacitor 510 and the coupling capacitor 410 may be theoretically converged into the capacitance Ccup of the coupling capacitor 410.

As a result, a slight potential variation at the floating diffusion column line CL1 due to a relatively large capacitance may be amplified to a greater potential variation due to the coupling capacitor 410 with a relatively small capacitance.

The coupling capacitor 410 may be included in each of charge/voltage conversion circuits, thereby preventing a reduction of CG that may be caused by an overlapping of m number of floating diffusion regions FD and the floating diffusion column line CL1.

Referring to FIG. 4 again, the drive transistor MD may detect a potential variation of the coupling capacitor Ccup. The drive transistor MD may convert the detected potential variation into a voltage signal, and then output the voltage signal to the CDS & ADC 130.

The drive transistor MD may include a fourth gate terminal G4, a fourth drain terminal D4, and a fourth source terminal S4. The fourth gate terminal G4 may be electrically connected to the third node N3 to receive a potential of the second terminal T2 of the coupling capacitor 410 through the third node N3. The fourth drain terminal D4 may be electrically connected to the power supply voltage (VDD) terminal to receive the power supply voltage VDD. The fourth source terminal S4 may be electrically connected to an output node OUT.

A DC biasing unit 420 may enhance an operation characteristic of the drive transistor MD. As illustrated in FIG. 4, the DC biasing unit 420 may include a first resistance R1 and a second resistance R2, which may be connected to each other in series.

Referring back to FIG. 1, in the conventional 4T type CIS, it may not be possible to perform a DC biasing since the drive transistor (16 of FIG. 1) may be provided in the pixel (10 of FIG. 1). That is, since a gate voltage of the drive transistor (16 of FIG. 1) may be fixed to the power supply voltage (VDD) terminal, a potential of the power supply voltage (VDD) terminal may be lowered when signal charge is transferred to the floating diffusion region FD by the transfer transistor 14. Generally, due to the signal charge, a voltage drop at the gate terminal of the drive transistor 16 may be insufficient so that the drive transistor 16 may be operated in a triode region. In this case, a voltage gain may be reduced to much less than one, where one is an ideal value.

However, for a CMOS image sensor according to example embodiments, the drive transistor MD may be provided outside a pixel PX, thereby allowing the DC biasing to be performed.

Figure 7:
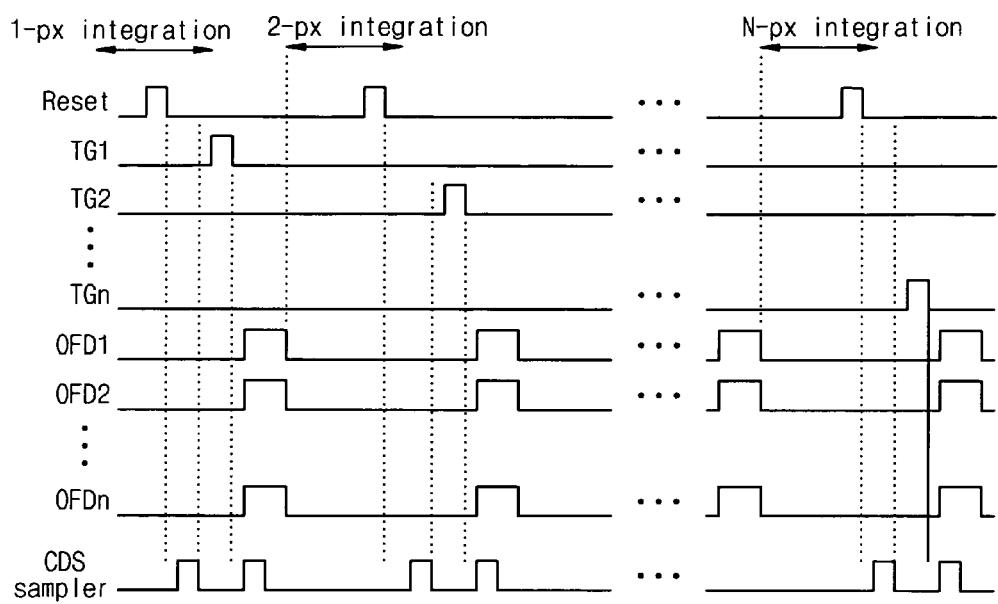
FIG. 7 is a timing diagram illustrating an operation of a plurality of pixels as illustrated in FIG. 5.

FIG. 7 is a timing diagram illustrating an operation of a plurality of pixels as illustrated in FIG. 5.

Referring to FIG. 7, the CDS & ADS 130 may sample a signal outputted from the pixel sensor array 110 twice.

First, each of the floating diffusion regions FD overlapping each of the floating diffusion column lines CL1 to CLm may be reset by a reset gate signal RESET. Next, photocharges with optical information may be transferred to the floating diffusion region FD by means of transfer gate signals TG1 to TGn. Then, a CDS sampler included in the CDS & ADS 130 may start sampling.

Next, the floating diffusion region FD may again be reset by an operation of a reset transistor MR. After the photo charges are transferred by the transfer gate signals TG1 to TGn, the photodiode PD may again be reset by overflow drain signals OFD1 to OFDn. In this case, the overflow drain signals OFD1 to OFDn may be provided to each the overflow drain transistors MO.

Photocharges with optical information may begin to be integrated after the photodiode PD is reset. The integration of the photocharges may simultaneously occur in all photodiodes PD. Excess photocharges may be discharged by the operation of the overflow drain transistor MO driven by the overflow drain signals OFD1 to OFDn, thereby preventing a blooming.

A CMOS image sensor according to example embodiments may diversely apply to home appliances such as a digital camera and a mobile phone; medical equipment such as an endoscope; military equipment such as a remote control missile; space equipment such as a satellite, etc.

According to example embodiments as described above, the number of transistors used in a unit pixel may be significantly reduced to improve a fill factor, thereby increasing photosensitivity of the image sensor.

The above-disclosed subject matter is to be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A CMOS image sensor comprising:
    at least one floating diffusion column line; and
    a charge/voltage conversion circuit connected to an end of the floating diffusion column line, the charge/voltage conversion circuit to detect a potential variation of the floating diffusion column line using a coupling capacitor, wherein
    the charge/voltage conversion circuit includes,
        the coupling capacitor having a first electrode connected to an end of the floating diffusion column line, and
        a drive transistor having a gate terminal connected to a second electrode of the coupling capacitor, a drain terminal connected to a power supply voltage, and a source terminal connected to an output terminal.

2. The CMOS image sensor of claim 1, wherein the CMOS image sensor further comprises:
    a plurality of pixels connected to the floating diffusion column line in parallel.

3. The CMOS image sensor of claim 2, wherein each of the plurality of pixels includes:
    a photodiode;
    a transfer transistor configured to transfer photocharges generated by the photodiode to the floating diffusion column line; and
    an overflow drain transistor configured to discharge excess photocharges integrated in the photodiode.

4. The CMOS image sensor of claim 2, wherein the plurality of pixels transfer the photocharges to the floating diffusion column line sequentially.

5. The CMOS image sensor of claim 1, wherein the charge/voltage conversion circuit further includes a reset transistor connected between a power supply voltage terminal and the floating diffusion column line, the reset transistor controlled in response to a reset gate signal.

6. The CMOS image sensor of claim 1, wherein a charge/voltage variation of the coupling capacitor is greater than a charge/voltage variation of the floating diffusion column line, the charge/voltage variation being a ratio of a voltage variation of a voltage signal outputted from the drive transistor to a charge variation of the floating diffusion column line.

7. The CMOS image sensor of claim 1, wherein a capacitor of the floating diffusion column line and the coupling capacitor are connected in series, and total capacitance of the floating diffusion column line and the coupling capacitor is a combination mean value of the capacitances of the floating diffusion column line and the coupling capacitor.

8. The CMOS image sensor of claim 1, wherein a capacitor of the floating diffusion column line and the coupling capacitor are connected to each other in series, and total capacitance of the floating diffusion column line and the coupling capacitor is expressed as $$C_{tot} = \frac{C_{fds} C_{cup}}{C_{fds} + C_{cup}}$$

where Ctot is the total capacitance, Cfds is the capacitance of the capacitor of the floating diffusion column line, and Ccup is the capacitance of the coupling capacitor.

9. The CMOS image sensor of claim 1, wherein the charge/voltage conversion circuit further includes a DC biasing unit to couple and drive a DC voltage and the potential variation outputted through a second terminal to the gate terminal of the drive transistor.

10. The CMOS image sensor of claim 9, wherein the DC biasing unit includes:
a first load connected between the power supply voltage terminal and the gate terminal of the drive transistor; and
a second load connected between the gate terminal of the drive transistor and a ground voltage terminal.

11. The CMOS image sensor of claim 10, wherein each of the first and second loads is a resistor.

12. A method of operating a CMOS image sensor, comprising:
transferring an electric signal to a floating diffusion column line; and
detecting a potential variation of the floating diffusion column line using a coupling capacitor, wherein
a capacitor of the floating diffusion column line and a coupling capacitor are connected to each other in series, and total capacitance of the floating diffusion column line and the coupling capacitor is expressed as $$Ctot = \frac{CfdsCcup}{Cfds + Ccup}$$

where Ctot is the total capacitance, Cfds is the capacitance of the capacitor of the floating diffusion column line, and Ccup is the capacitance of the coupling capacitor.

13. The method of claim 12, further comprising:
converting an optical signal into the electric signal.

14. The method of claim 13, wherein the converting includes:
transferring photocharges generated by a photodiode to the floating diffusion column line; and
discharging excess photocharges integrated in the photodiode.

15. The method of claim 12, wherein the detecting includes controlling a reset transistor in response to a reset gate signal.

16. The method of claim 15, wherein the detecting further includes coupling and driving a DC voltage.

* * * * *